(12) United States Patent
Tanaka et al.

(10) Patent No.: US 9,487,690 B2
(45) Date of Patent: *Nov. 8, 2016

(54) ANISOTROPIC HEAT CONDUCTIVE COMPOSITION AND MOLDED PRODUCT THEREOF

(71) Applicant: PANASONIC CORPORATION, Osaka (JP)

(72) Inventors: Atsushi Tanaka, Osaka (JP); Naomi Nishiki, Kyoto (JP); Kazuhiro Nishikawa, Osaka (JP); Hidetoshi Kitaura, Osaka (JP); Kimiaki Nakaya, Osaka (JP); Katsufumi Shimanaka, Hyogo (JP); Akiyoshi Azechi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/360,872

(22) PCT Filed: Nov. 12, 2012

(86) PCT No.: PCT/JP2012/007244
§ 371 (c)(1),
(2) Date: May 27, 2014

(87) PCT Pub. No.: WO2013/099089
PCT Pub. Date: Jul. 4, 2013

(65) Prior Publication Data
US 2015/0030835 A1    Jan. 29, 2015

(30) Foreign Application Priority Data
Dec. 27, 2011 (JP) .................. 2011-285660

(51) Int. Cl.
*C09K 5/14* (2006.01)
*C08J 5/18* (2006.01)
(Continued)

(52) U.S. Cl.
CPC .. *C09K 5/14* (2013.01); *C08J 5/18* (2013.01); *C08K 7/00* (2013.01); *H05K 9/0007* (2013.01); *H05K 9/0083* (2013.01); *C08J 2323/16* (2013.01); *C08K 2201/001* (2013.01)

(58) Field of Classification Search
CPC ............ C09K 5/14; C09K 5/08; C08K 7/00; C08K 2201/001; C08J 5/18; C08J 2323/16; C08L 101/00
See application file for complete search history.

(56) References Cited

U.S. PATENT DOCUMENTS 5,863,467 A    1/1999   Mariner et al.
2002/0197923 A1  12/2002  Tobita et al.
(Continued)

FOREIGN PATENT DOCUMENTS

EP    0 805 463 A1    11/1997
EP    2 583 993 A1    4/2013
(Continued)

OTHER PUBLICATIONS

Toshihiro et al. (EPO Website Machine English Translation of JP 2007-106902, Apr. 26, 2007).*
(Continued)

*Primary Examiner* — Laura Auer
(74) *Attorney, Agent, or Firm* — McDermott Will & Emery LLP (57) ABSTRACT

The present invention relates to an anisotropic heat conductive composition including flake graphite particles and a resin composition for the particles to be dispersed therein. When the particles have a basal plane, a maximum diameter a in a direction of the basal plane, and a thickness c perpendicular to the basal plane, a/c is 30 or more on average, and a content of the particles is more than 40 mass % and 90 mass % or less. Since the composition includes the particles having a particular shape, when it is formed into a sheet, an anisotropic heat conductive path can be efficiently created therein. Thus, the present invention can provide a molded product in sheet form, suited to have therein a heat conductive path capable of dispersing heat from a high temperature region to a low temperature region.

13 Claims, 4 Drawing Sheets (51) Int. Cl.
*C08K 7/00* (2006.01)
*H05K 9/00* (2006.01)

(56) References Cited

U.S. PATENT DOCUMENTS

2005/0258394 A1* 11/2005 Bacher et al. .................. 252/70
2006/0154070 A1* 7/2006 Wakiya ................ B22F 1/0062
428/403
2007/0275611 A1* 11/2007 Rehbein et al. ............. 439/886

FOREIGN PATENT DOCUMENTS

| JP | 11-00621 A | 1/1999 |
| JP | 11-01621 A | 1/1999 |
| JP | 2002-363421 A | 12/2002 |
| JP | 2007-031611 A | 2/2007 |
| JP | 2007-106902 A | 4/2007 |
| JP | 2007-224265 A | 9/2007 |
| JP | 2009-149769 A | 7/2009 |
| JP | 2010-077392 A | 4/2010 |
| WO | 2006/126606 A1 | 11/2006 |

OTHER PUBLICATIONS

Noriaki et al. (EPO Website Machine English Translation of JP 2009-149769, Jul. 9, 2009).*
International Search Report issued in International Application No. PCT/JP2012/007244 with Date of mailing Dec. 25, 2012, with English Translation.
Extended European Search Report issued in corresponding European Patent Application No. 12861965.7, on May 7, 2015; 5 pages.

* cited by examiner

ANISOTROPIC HEAT CONDUCTIVE COMPOSITION AND MOLDED PRODUCT THEREOF

RELATED APPLICATIONS

This application is the U.S. National Phase under 35 U.S.C. §371 of International Application No. PCT/JP2012/007244, filed on Nov. 12, 2012, which in turn claims the benefit of Japanese Application No. 2011-285660, filed on Dec. 27, 2011, the disclosures of which Applications are incorporated by reference herein.

TECHNICAL FIELD

The present invention relates to an anisotropic heat conductive composition with excellent heat conductivity, and a molded product thereof.

BACKGROUND ART

With increase in the number of semiconductor devices packed on a single printed circuit board, more importance is being placed on the issue of heat dissipation from printed circuit boards having thereon heat-generating electronic components. For a heat-dissipating mechanism, creation of a heat conductive path for connecting a high temperature region to a low temperature region has been proposed. As products capable of having such a heat conductive path created therein, various heat-dissipating sheets have been developed. A heat-dissipating sheet is required to have steady levels of heat conductivity, strength, and shielding ability. Therefore, to improve heat conductivity and other properties of a heat-dissipating sheet, a composition comprising a graphite material is being considered for use in sheet form.

For example, Patent Literature 1 proposes a heat conductive composition comprising: graphite particles having an aspect ratio in a range of 10 to 20, and an average particle size of 10 to 200 μm; and a matrix of thermosetting resin with the particles dispersed therein.

Patent Literature 2 proposes an elastomer composition comprising: pitch carbon fibers or graphite chips; and an elastomer component with the fibers or chips dispersed therein. Here, the pitch carbon fibers are short fibers of 150 μm to 2 mm; and the graphite chips are 10 μm to 150 μm in thickness, 100 μm to 1 mm in width, and 150 μm to 2 mm in length.

CITATION LIST

Patent Literatures

[Patent Literature 1] Japanese Laid-Open Publication No. 2007-224265
[Patent Literature 2] Japanese Laid-Open Publication No. 2009-149769

SUMMARY OF INVENTION

Technical Problem

However, regarding a composition including ordinary graphite particles, its heat conductivity increases linearly in rough proportion to its graphite particle content. That is, the heat conductivity of the composition would improve, if the graphite particle content is increased. However, with the increase in the graphite particle content, the moldability of the composition becomes more reduced, or, the sheet molded from the composition becomes more fragile. Therefore, as in Patent Literature 1, a mere dispersion of graphite particles in a matrix of thermosetting resin, only results in limited improvement of the heat conductivity of the composition.

Figure 9:
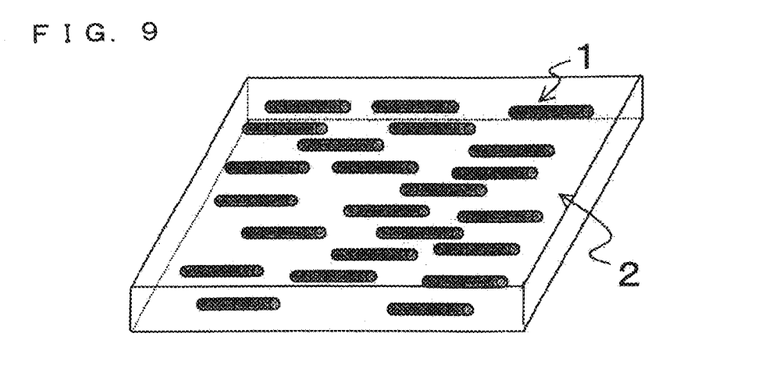
FIG. 9 A conceptual illustration depicting an orientation of carbon fibers in a conventional anisotropic heat conductive composition

On the other hand, as in Patent Literature 2, in the case of a composition including carbon fibers, it is presumed that carbon fibers 1 being oriented in one direction in a matrix resin 2 as illustrated in FIG. 9, enables improvement of heat conductivity in that one direction. However, since the carbon fibers 1 can disperse heat efficiently only in a direction of their length, it is difficult to create a heat conductive path capable of inducing high levels of heat dissipation.

In view of the foregoing, an object of the present invention is to provide a composition suited to be made into sheet form; and also, capable of having an excellent anisotropic heat conductive path created therein when in sheet form.

Solution to Problem

One aspect of the present invention relates to an anisotropic heat conductive composition comprising: flake graphite particles; and a resin component for the particles to be dispersed therein. When a is a maximum diameter of a basal plane of the particles, and c is a thickness in a direction perpendicular to the basal plane, a/c is 30 or more on average, and a content of the particles is more than 40 mass % and 90 mass % or less.

Another aspect of the present invention relates to a molded product of the foregoing anisotropic heat conductive composition, in which the molded product is in a form of a sheet, and the basal plane of the flake graphite particles is oriented in a planar direction of the sheet.

Advantageous Effects of Invention

Since the anisotropic heat conductive composition of the present invention includes flake graphite particles that are of a particular shape, when it is formed into a sheet, an anisotropic heat conductive path can be efficiently created in the sheet. Thus, the present invention can provide a molded product in sheet form (e.g., heat-dissipating sheet) suited to have therein a heat conductive path for dispersing heat from a high temperature region to a low temperature region.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

An anisotropic heat conductive composition of the present invention comprises: flake graphite particles; and a resin composition for the particles to be dispersed therein. When shear stress or pressure is applied to such composition, a basal plane of the particles becomes oriented in one direction; and by such orientation of the particles, the composition is able to exhibit larger heat conductivity in that one direction. If the composition is molded into a sheet, the basal plane of the flake graphite particles becomes oriented in a planar direction of the sheet, and the composition exhibits excellent heat conductivity in that planar direction. The above sheet is suitable as a heat-dissipating sheet creating a heat conductive path between a high temperature region and a low temperature region of a printed circuit board or the like having thereon heat-generating electronic components.

Here, when the flake graphite particles have a maximum diameter a in a direction parallel to the basal plane, and a thickness c in a direction perpendicular to the basal plane, a ratio a/c of the maximum diameter a (hereafter, longer diameter a) to the thickness c, is 30 or more on average. The longer diameter a is preferably 1 μm to 30 μm. Moreover, when the particles have a maximum diameter b (hereafter, shorter diameter b) perpendicular to the maximum diameter a, a ratio a/b of the longer diameter a to the shorter diameter b, is preferably 1 to 20. When the flake graphite particles have a particular shape as defined above, there is a higher probability of the flake graphite particles coming in contact with one another when they are oriented in one direction; and there is a larger contact area between the particles at their contact point. Therefore, a heat conductive path can be created with efficiency. Moreover, due to the flake graphite particles having the above particular shape, it becomes easier to mold the composition into a sheet.

Figure 1:
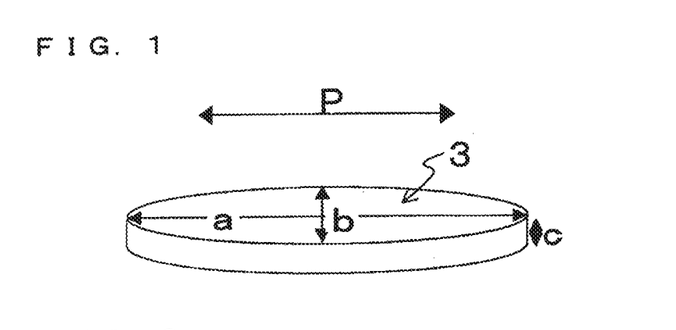
FIG. 1 A conceptual illustration depicting the shape of a flake graphite particle FIG. 2 A conceptual illustration depicting an orientation of the flake graphite particles in an anisotropic heat conductive composition of the present invention FIG. 3 A conceptual illustration depicting a method for evaluating the orientation of the flake graphite particles FIG. 4 An SEM image of a section of a sheet formed from a composition of Comparative Example 1, the section being parallel to a direction of an X axis of the sheet (i.e., the direction in which the composition flows during formation of the sheet)

As illustrated in FIG. 1, the longer diameter a of the flake graphite particle 3 is a maximum diameter thereof in a direction P (direction of left right arrow) parallel to the basal plane of the particle 3. Moreover, the shorter diameter b of the flake graphite particle 3 is a width thereof of the largest value, perpendicular to the longer diameter a. The ratio (i.e., aspect ratio) of the longer diameter a to the shorter diameter b may be 1, and when 1, the longer diameter a and the shorter diameter b are interchangeable. Furthermore, as illustrated in FIG. 1, the thickness c of the flake graphite particle 3 is a maximum diameter in the direction perpendicular to the basal plane.

A content of the flake graphite particles in the overall anisotropic heat conductive composition is controlled to be more than 40 mass % and 90 mass % or less. This is because when the content is in this range, contact between the flake graphite particles becomes remarkable, and thus, there is a non-linear increase in the heat conductivity. That is, when the flake graphite particles of the above shape is used, a composition which realizes a sufficiently high heat conductivity can be obtained, even if the amount of the particles used is smaller compared to when a conventional ordinary flake graphite particles are used.

In a molded product of the anisotropic heat conductive composition in a form of a sheet, a larger angle and a smaller angle are created by the basal plane of the flake graphite particles and the planar direction of the sheet, and the smaller angle, i.e., angle θ, is preferably 1° to 30° on average. By the flake graphite particles with the a/c ratio of 30 or more being oriented such that the angle θ does not exceed 30°, the molded product is able to have an anisotropic heat conductivity that is remarkably high. Use of such a molded product enables creation of a heat conductive path for effectively dispersing heat from heat-generating elements such as electronic components.

In the following, components of the anisotropic heat conductive composition of the present invention will be described in more detail.

(Production of Flake Graphite Particles)

Flake graphite particles having the a/c ratio of 30 or more, can be obtained, for example, by pulverizing a graphite film. Alternatively, a natural graphite may be processed and turned into flakes having the a/c ratio of 30 or more. One kind of flake graphite particles may be used singly; or two or more kinds of flake graphite particles may be used, as long as the longer diameter a and the a/c ratio satisfy the conditions given above.

A graphite film can be obtained by graphitizing a polymer film by baking it at a high temperature of 2,400° C. or higher and preferably 2,600 to 3,000° C. in an inert gas atmosphere. The baking may be performed in a single step; or in two or more steps with a change in temperature for each step. The inert gas is not particularly limited, but is preferably nitrogen or argon due to low cost. Baking time is not particularly limited, but is preferably, for example, 2 to 6 hours.

A thickness of the polymer film before graphitization may be selected as appropriate in accordance with the thickness c of the flake graphite particles; but is, for example, 400 μm or less, and preferably 10 to 200 μm. Even when the polymer film, i.e., a starting material, is comparatively thick, it is all the more possible to obtain flake graphite particles that are thin. This is because the graphite of the graphite film is exfoliated into individual layers, when the graphite film is pulverized.

Examples of a material for the polymer film, considered preferable, include: polyimide, poly amide imide, polyoxadiazole, polybenzothiazole, polybenzobisthiazole, polybenzoxazole, polybenzobisthiazole, poly(p-phenylene isophthalamide), poly(m-phenylene benzimidazole), poly(phenylene benzobisimidazle), polythiazole, and polyparaphenylene vinylene. The manner in which these materials are formed into a film, is not particularly limited. These materials may be used singly, or in a combination of two or more. For example, two or more different kinds of films may be graphitized, pulverized, and then mixed; or two or more different kinds of materials, composed or alloyed in advance, may be formed into a film and then graphitized.

The graphite film obtained is pulverized to obtain flake graphite particles. The method used for pulverization is not particularly limited. However, it is preferable that the graphite particles are made to collide against one another, or that the graphite particles are made to physically collide against a hard material serving as a medium. Examples of the method used for pulverization include ball milling, nanomizing, and jet milling.

A thickness of the graphite film to be pulverized may be selected as appropriate in accordance with the intended thickness c of the flake graphite particles, and is, for example, 1 µm to 100 µm.

In the case of processing a natural graphite, it is preferable that a natural graphite is pretreated by having it immersed in sulfuric acid and then heated, thereby causing layers therein to expand. After such pretreatment, shear stress is applied to the expanded graphite, thereby accelerating separation of the layers. As a result, flake graphite particles having the thickness c of 1 µm or less can be obtained.

(Shape of Flake Graphite Particles)

The flake graphite particles have a shape as illustrated in FIG. 1 for example, and the a/c ratio is required to be 30 or more as mentioned above.

If the a/c ratio is less than 30, there are less contact points between the graphite particles, and the effect of improving anisotropic heat conductivity becomes small. The a/c ratio is preferably 80 or more, in terms of further increasing the number of contact points between the flake graphite particles and to further enlarge the contact area between the particles at each of the contact points; whereas the ratio a/c is preferably 200 or less, and further preferably 150 or less, in terms of maintaining the shape of the graphite particles in the resin component.

The longer diameter a of the flake graphite particles is preferably 1 µm to 30 µm. If the longer diameter a is less than 1 µm, the orientation of the flake graphite particles in the resin component would be difficult. For example, even if the composition is molded into a sheet by extrusion or rolling, it may be difficult to secure a sufficient number of contact points, and sufficient contact areas, between the flake graphite particles. In contrast, if the longer diameter a is more than 30 µm, there would be lower dispersibility of the graphite particles in the resin component, and sufficient heat conductivity may not be obtained. Therefore, the longer diameter a is preferably 3 to 25 µm, to facilitate the orientation of the graphite particles and to also secure good dispersibility thereof in the resin component.

Due to the a/c ratio of the flake graphite particles being 30 or more, the thickness c thereof is small. For example, when the longer diameter a is 30 µm or less, the thickness c is 1 µm at most. As long as the flake graphite particles are thin as above, the ratio a/b of the longer diameter a to the shorter diameter b of the particles is not particularly limited, but is preferably 1 to 20. If the ratio a/b is more than 20, it may be difficult for the flake graphite particles to maintain their shape in the resin component.

Here, the longer diameter a, the shorter diameter b, and the thickness c are each obtained by averaging out 20 of the flake graphite particles. That is, for each of 20 particles arbitrarily selected from the flake graphite particles, the longer diameter a, the shorter diameter b, and the thickness c are measured; and then, the ratio a/b and the ratio a/c are calculated. Then, the average is obtained for each of the parameters. A scanning electron microscope can be used to measure the longer diameter a, the shorter diameter b, and the thickness c.

The particle size distribution of the flake graphite particles obtained by pulverizing the graphite film, is normal or close to normal. Therefore, for each of the parameters, an average is preferably obtained by selecting and using 20 of the flake graphite particles having the longer diameter a which fall within a ±30% deviation from the median diameter. The median diameter is a diameter at 50% of the cumulative volume obtained with a laser diffraction particle size analyzer.

Alternatively, two or more kinds of flake graphite particles having different particle size distributions may be used. Even in that case, the kinds of the flake graphite particles are not particularly limited, as long as the average a/c ratio of the particles in the particle mixture is 30 or more. In that case, the average longer diameter a of the particles in the particle mixture is preferably 1 µm to 30 µm.

(Resin Component)

The resin component is not particularly limited, and examples thereof include various thermoplastic resins and elastomers. The resin component may also be a mixture of a thermoplastic resin without rubber elasticity and an elastomer. Among the above, elastomers are preferred. Moreover, 50 mass % or more of the resin component is preferably an elastomer.

Examples of the thermoplastic resin include: styrene copolymers such as styrene-acrylonitrile copolymer, styrene-maleic anhydride copolymer, and (meth)acrylate ester-styrene copolymer; rubber reinforcing resin such as ABS resin and AES resin; olefin polymers such as polyethylene, polypropylene, ethylene-vinyl acetate copolymer, ethylene-vinyl alcohol copolymer, and chlorinated polyethylene; vinyl chloride polymers such as polyvinyl chloride, ethylene-vinyl chloride copolymer, and polyvinylidene chloride; (meth)acrylate ester polymers such as polymethyl methacrylate; imide polymers such as polyamide, polyimide, polyamide-imide, and polyetherimide; polyester polymers such as polyethylene terephthalate and polybutylene terephthalate; polyacetal; polycarbonate; polyarylate; polyphenylene ether; polyphenylene sulfide; fluorine resins such as polytetrafluoroethylene and polyvinylidene fluoride; ketone compounds such as polyetherketone and polyether ether ketone; sulfone compounds such as polysulfone and polyethersulfone; urethane compounds; and polyvinyl acetate. These may be used singly, in a combination of two or more, or in an alloy material of two or more.

The elastomer is not particularly limited, and examples thereof include chloroprene rubber, isoprene rubber, natural rubber, styrene-butadiene rubber, butadiene rubber, butyl rubber, ethylene-propylene rubber, ethylene-propylene-diene rubber (EPDM), nitrile rubber, urethane rubber, acrylic rubber, silicone rubber, fluorine rubber, and hydrogenated nitrile rubber. These may be used singly, or in a combination of two or more.

(Additives)

The anisotropic heat conductive composition of the present invention can include various additives, in addition to the flake graphite particles and the resin composition. Various additives are used, particularly when the anisotropic heat conductive composition is a rubber composition which includes an elastomer. The additives for the rubber composition are not particularly limited, and there are, for example, a cross-linking agent for producing cross-links among the rubber components, a carbon black (e.g., Ketjen black, acetylene black) for improving mechanical strength of the rubber components, and a moderate amount of plasticizer for adjusting rubber hardness. In addition to the above, a secondary vulcanizing agent such as stearic acid, an antioxidant, oil, a lubricant, and/or inorganic particles (e.g., silica particles, alumina particles), for example, can be added to the composition, as appropriate.

For the cross-linking agent, a sulfur-based cross-linking agent (vulcanizing agent), a peroxide, or the like is preferably added in moderate amounts to the composition. When a silicone rubber is used in the resin component, a curing agent for curing silicone (e.g., tertiary amine compound) is preferably added. Moreover, a curing accelerator such as zinc oxide, active zinc oxide, or the like may be added in moderate amounts to the composition.

The amount of the additives is preferably 30 mass % or less of the overall anisotropic heat conductive composition. This is because, due to the moderate amount of the additives, quantitative balance is maintained between the flake graphite particles and the resin component, thus enabling the composition to easily maintain good heat conductivity and to easily secure moldability and strength.

(Content of Flake Graphite Particles)

The anisotropic heat conductive composition of the present invention contains more than 40 mass % of the flake graphite particles. If the content of the flake graphite particles is less than 40 mass %, even when the particles have a particular shape as defined above, the number of contact points between the particles would be too small, and thus, there would be no prominent effect of increased contact areas between the particles. That is, when the composition contains the flake graphite particles in an amount of only 40 mass % or less, the extent of its anisotropic heat conductivity would be the same level as that of a composition containing ordinary flake graphite particles. When the content of the flake graphite particles is 40 mass % or less, heat conductivity of the composition merely increases linearly in rough proportion to the content of the particles. In contrast, when the anisotropic heat conductive composition contains more than 40 mass % of the flake graphite particles, heat conductivity of the composition increases non-linearly relative to the content of the particles. This is due to the shape of the particles being suited for securing sufficient contact area per contact point between the particles.

When the content of the flake graphite particles in the anisotropic heat conductive composition exceeds 90 mass %, the composition tends to become reduced in moldability and become weak.

In terms of securing sufficient moldability and strength for the composition while also achieving high heat conductivity therefor, the content of the flake graphite particles in the composition is preferably 90 mass % or less, and further preferably 80 mass % or less. Moreover, the content of the flake graphite particles in the composition is preferably more than 40 mass %, and further preferably more than 43 mass %. The upper limit and the lower limit for the content may be arbitrarily combined.

(Method for Producing Heat-Dissipating Sheet)

<First Step>

First, the anisotropic heat conductive composition is prepared. The manner of preparation is not particularly limited. The resin component, the flake graphite particles, and, as necessary, the additives to be included in the composition may each be blended in appropriate order and then kneaded. However, when the elastomer (rubber component) is used as the resin component, to avoid progression of cross-linking of the rubber due to heat generated during kneading, it is preferable that kneading is first performed without the rubber cross-linking agent; and thereafter, the agent is added, followed by further kneading.

The manner of kneading the composition is not particularly limited, and two-roll mixing can be given as an example. In two-roll mixing, the composition is passed through a gap between a pair of rolls to be formed into a sheet. As the composition is nipped between the rolls and passed through the gap therebetween, shear force is applied to the composition by the rotating rolls, and the composition becomes elongated in a direction parallel to the rotating direction of the rolls. At that time, along with the elongation of the matrix of the resin component, the flake graphite particles dispersed in the composition become oriented in the same direction. As a result, the basal plane of the flake graphite particles is successfully oriented in the planar direction of the sheet. To enhance the orientation of the flake graphite particles, the sheet is preferably passed through the rolls multiple times. Moreover, when the sheet sticks onto one of the rolls when coming out from between the rolls, the sheet is preferably separated from that roll, reversed, and then passed through the rolls again.

Before kneading the composition by two-roll mixing, the raw materials of the composition may be pre-kneaded with an internal mixer such as a Banbury mixer.

<Second Step>

Next, the composition is molded into a sheet with the intended thickness. The manner of molding the sheet is not particularly limited, as long as the sheet thickness can be adjusted. For example, calendaring is suitable in terms of easy application of sufficient pressure to the composition, in a direction parallel to the sheet thickness; and also, easy orientation of the basal plane of the flake graphite particles, in the planar direction of the sheet.

Typically, calendaring is suited for continuous production. In the calendaring process, a composition is fed to at least a pair of rollers to form a sheet, which is then taken out by a take-up roll. Sheet thickness can be made more precise, by rolling the composition between heated rolls and then between cold rolls, at a preliminary stage in the process.

Alternatively, the composition may be extruded after it is sufficiently kneaded by an internal mixer such as a Banbury mixer. Typically, in extrusion, a composition is successively pushed out of a metal nozzle or die that matches with a sheet shape, thereby to form a sheet. During extrusion, shear stress that develops in the extrusion direction is applied to the composition, causing the basal plane of the flake graphite particles to be oriented in the planar direction of the sheet. The extruded sheet may further undergo pressing between calendar rolls.

When the composition includes the rubber component, it is heated as necessary to promote cross-linking (vulcanization) by the cross-linking agent, thereby to obtain a sheet with excellent flexibility and strength. Thereafter, the sheet is cut in a direction perpendicular to its plane, thereby to obtain a product having an intended shape of a heat-dissipating sheet.

It is also possible to promote cross-linking of the rubber component, by applying sufficient heat energy to the composition while it is being passed between the heat rolls in calendaring.

(Orientation of Flake Graphite Particles)

Figure 2:
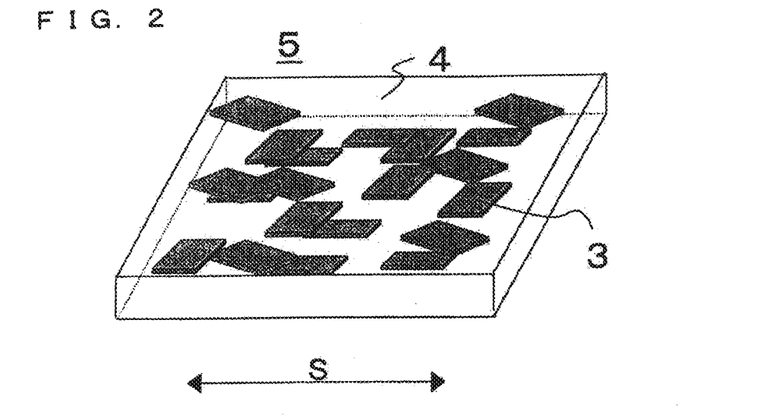

FIG. 2 conceptually depicts the inner structure of the anisotropic heat conductive composition molded into a sheet. The sheet 5 derived from the composition comprises a matrix resin 4 and the flake graphite particles 3 dispersed in the matrix resin 4. Inside the sheet 5 produced in the aforementioned manner, the flake graphite particles 3 are oriented such that the basal plane of the particles 3 and the planar direction S of the sheet 5 both face roughly the same direction, as illustrated in FIG. 2. Such orientation of the flake graphite particles 3 can be observed, by cutting the sheet 5 in a direction perpendicular to the planar direction S, and observing the resultant section with a scanning electron microscope.

Figure 3:
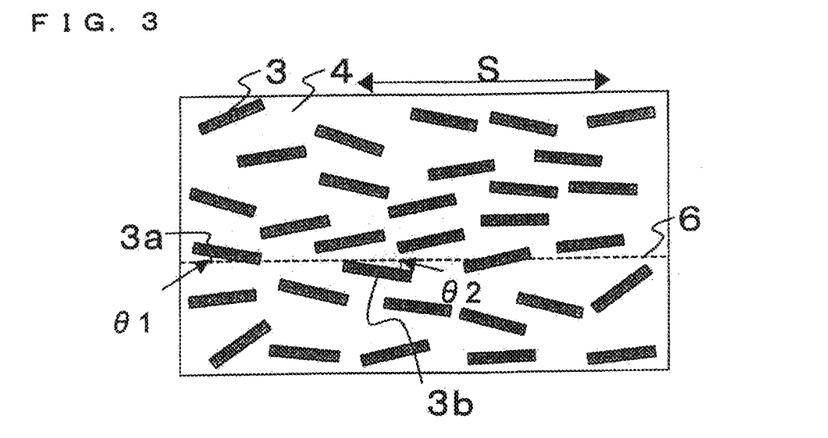

FIG. 3 conceptually depicts a section of the sheet 5 as illustrated in FIG. 2, perpendicular to the planar direction S thereof. A dashed line 6 in this depiction is a line of reference for measuring the extent of orientation of the flake graphite particles, the line arbitrarily drawn parallel to the planar direction S of the sheet 5. The extent of orientation of the flake graphite particles can be evaluated by the angle θ created by the reference line 6 parallel to the planar direction S of the sheet 5, and the basal plane of the flake graphite particles 3. However, note that the angle θ is an acute angle, and is evaluated in absolute values. That is, regarding the angle θ1 and the angle θ2 in FIG. 3, the former created by a planar direction of the graphite particle 3a and the reference line 6, and the latter created by a planar direction of the graphite particle 3b and the reference line 6, when these angles are of the same measure, the graphite particles 3a and 3b are oriented to the same extent.

Here, the average angle θ created by the basal plane of the flake graphite particles 3 and the planar direction S of the sheet 5, is preferably 1° to 30°. Due to the average angle θ being 1° or greater, a sufficient number of contact points between the graphite particles is secured, and therefore, a sheet with high heat conductivity can be obtained. To further increase the number of contact points between the graphite particles, the angle θ is further preferably 5° or greater. Moreover, due to the angle θ being 30° or smaller, the flake graphite particles 3 are oriented to the extent of sufficiently increasing heat conductivity in the planar direction S of the sheet 5. In contrast, heat conductivity in the thickness direction of the sheet will be suppressed.

The average angle θ is obtained by averaging out the angles θ of 20 of the flake graphite particles. That is, 20 particles are arbitrarily selected from the flake graphite particles observed in the section perpendicular to the planar direction S, the angle θ is measured for each of the 20 particles, and then, the angles θ of the 20 particles are averaged out.

In the following, a more detailed description will be given of the present invention based on Examples. However, note that the present invention is not limited by the following Examples.

Examples 1 to 4

(i) Production of Flake Graphite Particles

A polyimide film (Kapton film, available from Du Pont-Toray Co., Ltd.) 25 μm in thickness was heat treated for 4 hours at 2,600° C. in an argon gas atmosphere, thereby to obtain a graphite film. The graphite film obtained was then pulverized for 15 minutes, by using a jet mill. The number of rotations by the classifier during pulverization, was 20,000. The above resulted in obtaining flake graphite particles having a shape with the following parameter values.

Average longer diameter a: 5.5 μm
Average ratio of longer diameter a to thickness c (average ratio a/c): 100
Average ratio of longer diameter a to shorter diameter b (average ratio a/b): 2

(ii) Preparation of Anisotropic Heat Conductive Composition

The flake graphite particles obtained, EPDM (Esprene, available from Sumitomo Chemical Co., Ltd.), peroxide serving as a cross-linking agent, and stearic acid were mixed together. Then, the resultant mixture was sufficiently kneaded by using a two-roll mixer with 8-inch diameter rolls. As a result, an anisotropic heat conductive composition was prepared; and also, a planar direction P of the flake graphite particles inside the composition, was set for orientation.

Table 1 shows the flake graphite particle content in the anisotropic heat conductive composition, for each of the Examples.

In each of the Examples, the peroxide serving as the cross-linking agent was 2 mass % of the composition, and the stearic acid was 0.3 mass % of the composition. Subsequently, the composition was molded by using the aforementioned two-roll mixer, such that it became a sheet 1 mm in thickness. This was followed by heating at 170° C. for 10 minutes to promote vulcanization.

Examples 5 and 6

A graphite film obtained under the same conditions as Examples 1 to 4 was pulverized for 15 minutes, by using a jet mill with its classifier being set to rotate 7,000 times. This resulted in obtaining flake graphite particles having a shape with the following parameter values.

Average longer diameter a: 17 μm
Average ratio of longer diameter a to thickness c (average ratio a/c): 100
Average ratio of longer diameter a to shorter diameter b (average ratio a/b): 2

Except for the composition made to contain the above flake graphite particles in an amount shown in Table 1, an anisotropic heat conductive composition was prepared, molded into a sheet, and vulcanized in the same manner as Examples 1 to 4.

Comparative Example 1

Except for the composition made to contain the flake graphite particles used in Examples 1 to 4 in an amount shown in Table 2, an anisotropic heat conductive composition was prepared, molded into a sheet, and vulcanized in the same manner as Examples 1 to 4.

Comparative Example 2

Except for the composition made to contain the flake graphite particles used in Examples 5 and 6 in an amount shown in Table 2, an anisotropic heat conductive composition was prepared, molded into a sheet, and vulcanized in the same manner as Examples 5 and 6.

Comparative Examples 3 to 5

Comparative Examples 3 to 5 used flake graphite particles available from Chuetsu Graphite Works Co., Ltd., having a shape with the following parameter values.

Average longer diameter a: 160 μm
Average ratio of longer diameter a to thickness c (average ratio a/c): 12
Average ratio of longer diameter a to shorter diameter b (average ratio a/b): 1

Except for the composition made to contain the above flake graphite particles in an amount shown in Table 2, an anisotropic heat conductive composition was prepared, molded into a sheet, and vulcanized in the same manner as Example 1 to 4.

[Evaluation]

For the Examples and Comparative Examples, the heat conductivity and the orientation of the flake graphite particles were evaluated in the following manner. The results are shown in Tables 1 and 2.

(Measurement of Heat Conductivity)

For the Examples and Comparative Examples, heat diffusivity in the sheet was measured.

Here, a heat diffusivity α was measured by periodic heating, using a thermowave analyzer (TA3, available from Bethel Co., Ltd.) The primary effect of the present invention, is improvement in heat conductivity of the sheet in the planar direction thereof. Therefore, for a main flat surface of the sheet, a direction in which the composition flowed during formation of the sheet, was defined as an X axis; a direction perpendicular to the X axis was defined as a Y axis; and a direction parallel to the sheet thickness was defined as a Z axis. By measuring the heat conductivity, not only in the X-axis direction, i.e., the direction of shear stress application, but also in the Y-axis direction perpendicular to the X-axis direction, the effect of improved heat conductivity in the planar direction of the sheet was observed. Note that the heat diffusivity α is obtained by the following formula.

$$\alpha = \frac{\lambda}{\rho c} \quad (1)$$

α: heat diffusivity
λ: heat conductivity
ρ: density
c: specific heat (Conditions for Measurement)

A 30 mm×30 mm sample was cut out from the sheet, and then put on a sample stage for measurement.

(Heat Diffusivity in X-Axis and Y-Axis Directions)

The sample was periodically irradiated with a laser, i.e., heat wave, at a frequency of 0.5 to 3 Hz; and the phase difference between the heat waves were read, while the position for measurement was moved to a point 4 mm from the irradiated area. Next, a graph was created, the horizontal axis having distance plotted thereon, and the vertical axis having phase difference plotted thereon; and an inclination in the graph was obtained. Heat diffusivity was obtained from the inclination, by using a formula (2).

(Heat Diffusivity in Z-Axis Direction)

The sample was periodically irradiated with a laser, i.e., heat wave, at a frequency of 0.1 to 10 Hz; and the phase difference were read. Next, a graph was created, the horizontal axis having square root of frequency plotted thereon, and the vertical axis having phase difference plotted thereon; and an inclination in the graph was obtained. Heat diffusivity was obtained from the inclination, by using a formula (3).

$$\alpha = \frac{\pi f}{a^2} \quad (2)$$

$$\alpha = \frac{\pi d^2}{a^2} \quad (3)$$

α: heat diffusivity
f: frequency
a: inclination in graph
d: sample thickness (Orientation)

For the Examples and Comparative Examples, the orientation of the flake graphite particles in the sheet was observed by using a scanning electron microscope image (SEM image) of a section of the sheet, obtained by cutting the sheet in a direction perpendicular to the planar direction S of the sheet. Specifically, a reference line parallel to the planar direction S of the sheet, was drawn on the SEM image; and then, the angle θ, i.e., the acute angle created by the reference line and the basal plane of the flake graphite particles, was obtained.

TABLE 1

|  |  | Ex. 1 | Ex. 2 | Ex. 3 | Ex. 4 | Ex. 5 | Ex. 6 |
|---|---|---|---|---|---|---|---|
| Longer diameter a (μm) | | 5.5 | 5.5 | 5.5 | 5.5 | 17 | 17 |
| Longer diameter/Thickness (ratio a/c) | | 100 | 100 | 100 | 100 | 100 | 100 |
| Longer diameter/Shorter diameter (ratio a/b) | | 2 | 2 | 2 | 2 | 2 | 2 |
| Graphite particle content (mass %) | | 40.9 | 48.5 | 50 | 53 | 40.9 | 50 |
| Heat conductivity (W/m · K) | X-axis direction | 10.1 | 23 | 24.4 | 24 | 11 | 22 |
|  | Y-axis direction | 7.4 | 18 | 23.7 | 23.2 | 6.8 | 21 |
|  | Z-axis direction | 0.24 | 0.5 | 0.6 | 0.4 | 0.32 | 0.7 |
| θ(°) | | 16 | 16 | 15 | 15 | 14 | 13 |

TABLE 2

|  |  | Comp. Ex. 1 | Comp. Ex. 2 | Comp. Ex. 3 | Comp. Ex. 4 | Comp. Ex. 5 |
|---|---|---|---|---|---|---|
| Longer diameter a (μm) | | 5.5 | 17 | 160 | 160 | 160 |
| Longer diameter/Thickness (ratio a/c) | | 100 | 100 | 12 | 12 | 12 |
| Longer diameter/Shorter diameter (ratio a/b) | | 2 | 2 | 1 | 1 | 1 |
| Graphite particle content (mass %) | | 30.8 | 30.8 | 23 | 39 | 75 |
| Heat conductivity (W/m · K) | X-axis direction | 7.7 | 6.5 | 3.1 | 7 | 25 |
|  | Y-axis direction | 4.4 | 4.1 | 1.3 | 4.5 | 20 |
|  | Z-axis direction | 0.34 | 0.5 | 2.0 | 2.5 | 3.0 |
| θ(°) | | 15 | 16 | 17 | 19 | 17 |

Tables 1 and 2 show for the Examples and the Comparative Examples, the flake graphite particle content (mass %) relative to the total parts by mass of the composition; the heat conductivities in the X-axis and Y-axis directions (planar direction), and in the Z-axis direction (thickness direction); and the average extent of orientation (angle θ) of the flake graphite particles in the section of the sheet, parallel to the X-axis direction.

First, it became evident that the heat conductivities in the X-axis and Y-axis directions tended to increase as the graphite particle content increased. This is due to the increase of heat conductive path in the composition, due to the increase of the graphite particles that conduct heat in the planar direction.

It also became evident that the heat conductivity in the Z-axis direction increased as the graphite particle content increased, in the same manner as above. The heat conductivity in the Z-axis direction was lower than those in the X-axis and Y-axis directions, due to the anisotropy of the graphite particles. Although the graphite particles realized high heat conductivities in the X-axis and Y-axis directions (planar direction of the sheet), the heat conductivity in the Z-axis direction (thickness direction of the sheet) was about a hundredth of that in the planar direction. It is presumed that the heat conductivity in the Z-axis direction was lower than those in the X-axis and Y-axis directions, because the graphite particles, i.e., the anisotropic material, in the composition were oriented in the planar direction.

Secondly, comparing Examples 1 to 4 with Examples 5 and 6, even when the average longer diameter a of the flake graphite particles was changed from 5.5 μm to 17 μm, the results were not affected in particular, and the tendencies observed in Examples 1 to 4 were similar to those observed in Examples 5 and 6.

Figure 4:
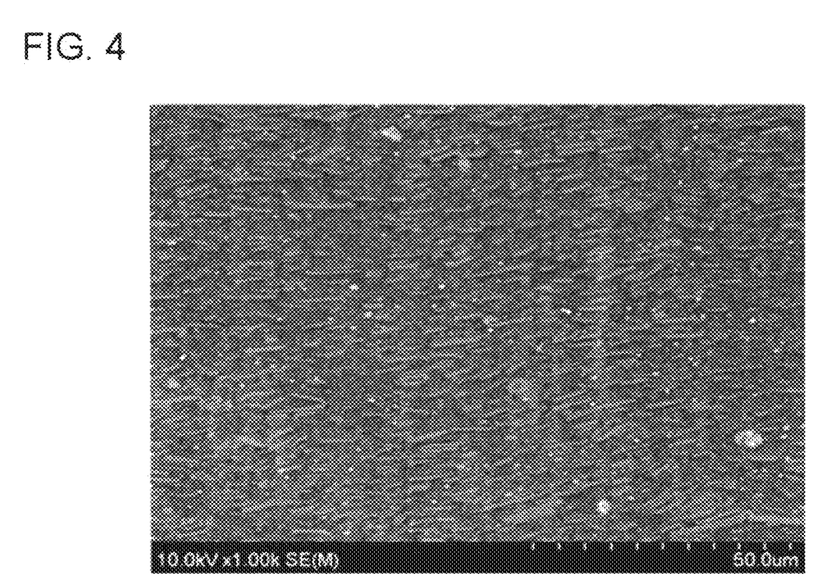
Figure 5:
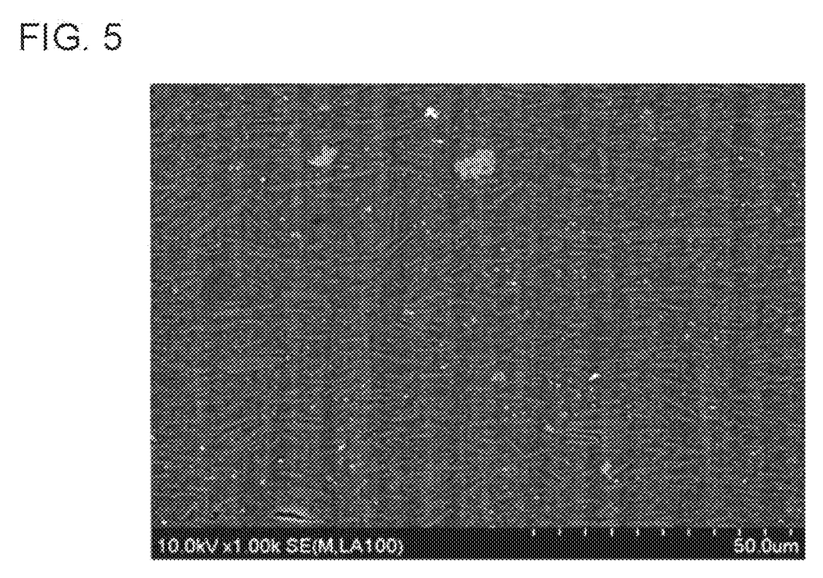
FIG. 5 An SEM image of a section of a sheet formed from a composition of Example 1, the section being parallel to the X-axis direction of the sheet FIG. 6 An SEM image of a section of a sheet formed from a composition of Example 3, the section being parallel to the X-axis direction of the sheet FIG. 7 An SEM image of a section of the sheet formed from the composition of Example 3, the section being parallel to a direction of a Y axis of the sheet (i.e., direction perpendicular to the X-axis direction)
Figure 6:
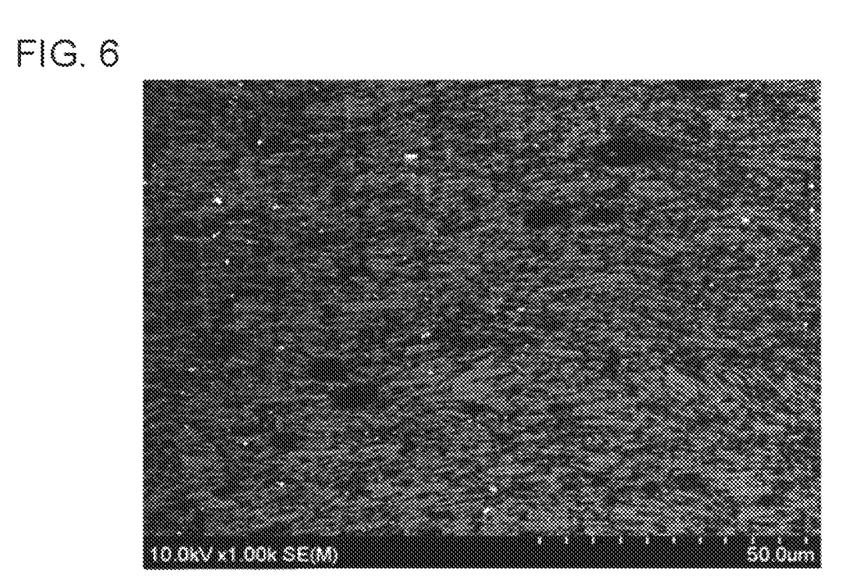
Figure 7:
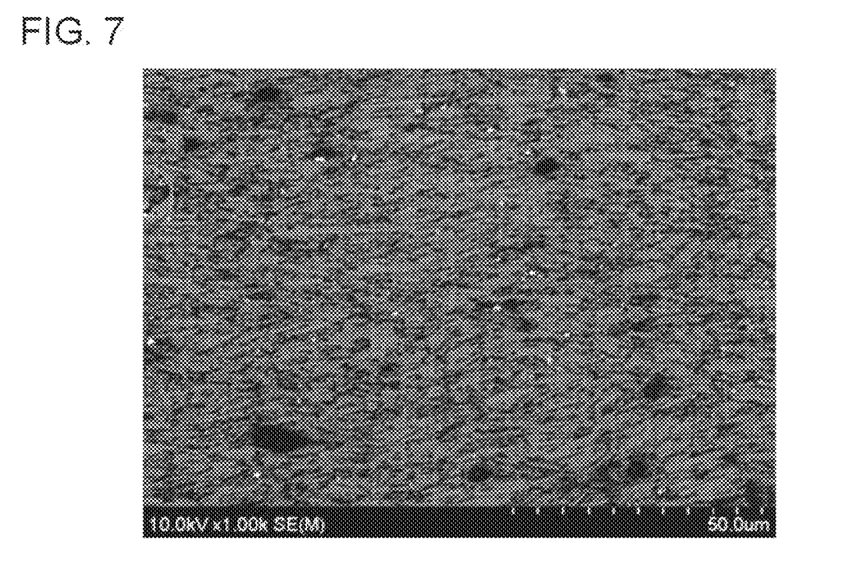

FIGS. 4 to 6 show SEM images of sections of the sheets, parallel to the X-axis direction thereof. FIG. 4, FIG. 5, and FIG. 6 are SEM images for Comparative Example 1, Example 1, and Example 3, respectively. FIG. 7 is an SEM image of a section of the sheet in Example 3, parallel to the Y-axis direction thereof.

In FIGS. 4 to 6, the flake graphite particles were observed as dispersed in the matrix of the rubber component, and oriented in a certain direction. Moreover, it became evident that contact points between the graphite particles increased, due to increase in the graphite particle content. Furthermore, from FIGS. 6 and 7, it became evident that the flake graphite particles were oriented, not only in the X-axis direction, but also in the Y-axis direction.

Figure 8:
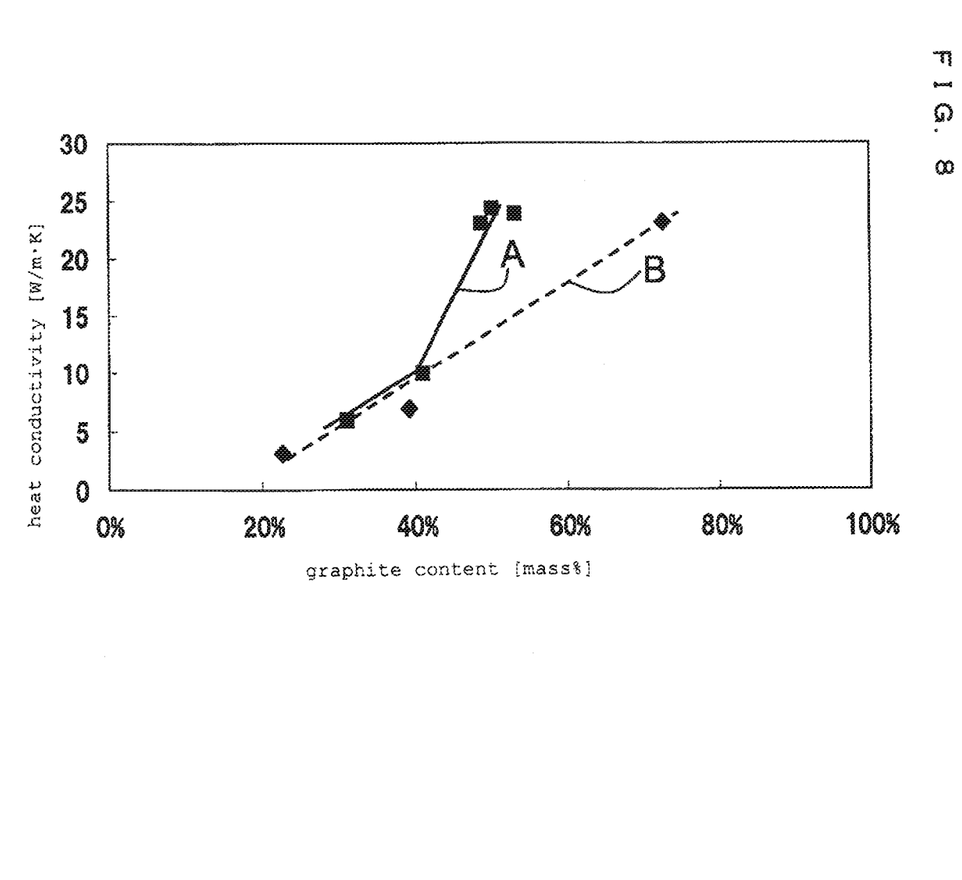
FIG. 8 A graph showing a relation between: flake graphite particle content in a composition of each of Examples 1 to 4 and Comparative Examples 1 and 3 to 5; and heat conductivity thereof, in which line A shows the relation among the compositions of Examples 1 to 4 and Comparative Example 1, and line B shows the relation among the compositions of Comparative Examples 3 to 5

FIG. 8 is a graph showing the relation between: the graphite particle content relative to the overall composition (horizontal axis); and the heat conductivity of the sheet, obtained in the composition (vertical axis). In the graph, line A is the result of plotting the above relation for the compositions of Examples 1 to 4 and Comparative Example 1; and line B is the result of plotting the above relation for the compositions of Comparative Examples 3 to 5. When a content of ordinary flake graphite particles is increased, increase in heat conductivity is linear. In contrast, in the present invention, when the content of the flake graphite particles with the required shaped was more than 40 mass %, rate of increase in heat conductivity changed remarkably.

The following is an observation on the reason why the foregoing non-linear behavior was obtained.

The effect of improved heat conductivity was achieved due to the increase in the number of contact points, and in the contact areas, between the flake graphite particles. Regarding the graphite particles in terms of the ratio a/c of the longer diameter a to the thickness c, and of the ratio a/b of the longer diameter a to the shorter diameter b, the particles with the larger ratios a/c and a/b had a wider range of movement when being oriented in the composition, compared to the particles with the smaller ratios a/c and a/b. However, even if the particles had a wide range of movement, when the distance between the particles were comparatively large, the probability of one of the particles coming in contact with the other nearby particles during orientation of the particles, did not change much regardless of the particle shape; and when the distance between the particle became smaller to a certain extent, the particles exerted their effect due to their shape. Moreover, the critical point where the particles started to exert their effect due to their shape was when their content was about 40 mass %.

In the foregoing Examples, the ratio a/c, i.e., the ratio of the longer diameter a to the thickness c, of the flake graphite particles was 100; however, when the ratio a/c was 30 or more, a sheet with an excellent heat conductivity was able to be obtained in the same manner.

In the foregoing Examples, the average longer diameter a of the flake graphite particles was 5.5 or 17 μm; however, when the average longer diameter a was further longer (e.g., up to 30 μm), a sheet with an excellent heat conductivity was able to be obtained in the same manner.

In the foregoing Examples, the ratio a/b, i.e., the ratio of the longer diameter a to the shorter diameter b of the graphite particles was 2; however, when the ratio a/b was 1 to 20, a sheet with an excellent heat conductivity was able to be obtained in the same manner.

In the foregoing Examples, the angle θ, i.e., the smaller angle created by the basal plane and the planar direction of the sheet, was 13° to 16° on average; however, when the angle θ was about 30° at most, a sheet with an excellent heat conductivity was able to be obtained in the same manner.

INDUSTRIAL APPLICABILITY

When the anisotropic heat conductive composition of the present invention is molded into a sheet, it exhibits a high heat conductivity in a planar direction. Therefore, the composition, when in sheet form, is useful as a heat-dissipating sheet for releasing heat from heat-generating elements, e.g., ICs and CPUs, to the outside.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

EXPLANATION OF REFERENCE NUMERALS 1 carbon fiber
2 matrix resin
3 flake graphite particles
4 matrix resin
5 sheet
6 line of reference

The invention claimed is:

1. A molded product of an anisotropic heat conductive composition in a form of a sheet having a principal plane, the molded product comprising:
   graphite flakes; and
   a resin in which the graphite flakes are dispersed, wherein:
   each of the graphite flakes has a basal plane, a first maximum length A measured in a first direction, a second maximum length B measured in a second direction perpendicular to the first direction, and a maximum thickness C measured in a direction perpendicular to the basal plane, the first maximum length A being a greatest length of a graphite flake, an average of first maximum lengths A/second maximum lengths B is 1 to 20, an average of first maximum lengths A of the graphite flakes is 1 μm to 30 μm, an average of first maximum lengths A/maximum thicknesses C is 30 or more, a content of the graphite flakes in the anisotropic heat conductive composition is more than 40 mass % and 90 mass % or less, and an acute angle θ in an absolute value is created by the basal plane of each of the graphite flakes and the principal plane of the sheet, and an average of acute angles θ is 1° to 30°.

2. The molded product in accordance with claim 1, wherein the average of first maximum lengths A/maximum thicknesses C is 200 or less.

3. The molded product in accordance with claim 1, wherein the content of the graphite flakes is more than 40 mass % and 53 mass % or less.

4. The molded product in accordance with claim 1, wherein the average of the acute angles θ is 5° to 30°.

5. The molded product in accordance with claim 1, wherein the average of the acute angles θ is 13° to 30°.

6. The molded product in accordance with claim 1, wherein the average of the acute angles θ is 13° to 16°.

7. The molded product in accordance with claim 1, further comprising a rubber.

8. The molded product in accordance with claim 7, wherein the rubber includes an elastomer.

9. The molded product in accordance with claim 7, further comprising a cross-linking agent for producing cross-links among the rubber.

10. The molded product in accordance with claim 7, further comprising a plasticizer for adjusting a hardness of the rubber.

11. The molded product in accordance with claim 9, wherein the cross-linking agent is a vulcanizing agent.

12. The molded product in accordance with claim 9, wherein the cross-linking agent is a peroxide.

13. The molded product in accordance with claim 1, wherein the sheet has:

a heat conductivity of 10.1 W/m·K to 24.4 W/m·K in a planar direction in the principal plane, a heat conductivity of 7.4 W/m·K to 23.7 W/m·K in a direction perpendicular to the planar direction in the principal plane, and a heat conductivity of 0.24 W/m·K to 0.7 W/m·K in a thickness direction of the sheet.

* * * * *